United States Patent [19]

Seaver

[11] 3,924,070

[45] Dec. 2, 1975

[54] VOICE GATED AMPLIFIER

[75] Inventor: F. Harmon Seaver, Walworth, Wis.

[73] Assignee: Webster Electric Company, Inc., Racine, Wis.

[22] Filed: Mar. 16, 1970

[21] Appl. No.: 19,651

[52] U.S. Cl. .............................................. 179/1 VC

[51] Int. Cl.² ............................................ H03F 3/72

[58] Field of Search ............... 179/1 VC, 1 SW, 1 P; 325/492, 478, 480; 324/478

[56] References Cited

UNITED STATES PATENTS

| | | | |
|---|---|---|---|
| 2,681,989 | 6/1954 | Cunniff | 325/478 |
| 2,840,699 | 6/1958 | Carpenter | 325/478 |
| 2,866,848 | 12/1958 | Fogel | 179/1 P |
| 3,126,449 | 2/1964 | Shirman | 179/1 P |
| 3,286,031 | 11/1966 | Geddes | 179/1 VC |
| 3,518,375 | 6/1970 | Hawkins | 179/1 VC |

FOREIGN PATENTS OR APPLICATIONS

| | | | |
|---|---|---|---|
| 1,148,273 | 8/1955 | Germany | 179/1 P |
| 1,168,975 | 10/1962 | Germany | 179/1 P |
| 1,094,357 | 12/1967 | United Kingdom | 179/1 VC |

OTHER PUBLICATIONS

Field Effect Transistors, Amelco Semiconductor, 6/62, p. 1.

*Primary Examiner*—Kathleen H. Claffy
*Attorney, Agent, or Firm*—Mason, Kolehmainen, Rathburn & Wyss

[57] ABSTRACT

A voice gated amplifier includes a multi-stage amplifier having a signal path coupling the successive stages of the amplifier. A normally nonconductive field effect transistor placed in series relation with the signal path interrupts the signal path to maintain the amplifier in a standby, nonoperating state. In response to an input signal of predetermined magnitude, a gating circuit renders the field effect transistor abruptly conductive thereby to place the amplifier in an operating state.

5 Claims, 2 Drawing Figures

Figures 1, 2:
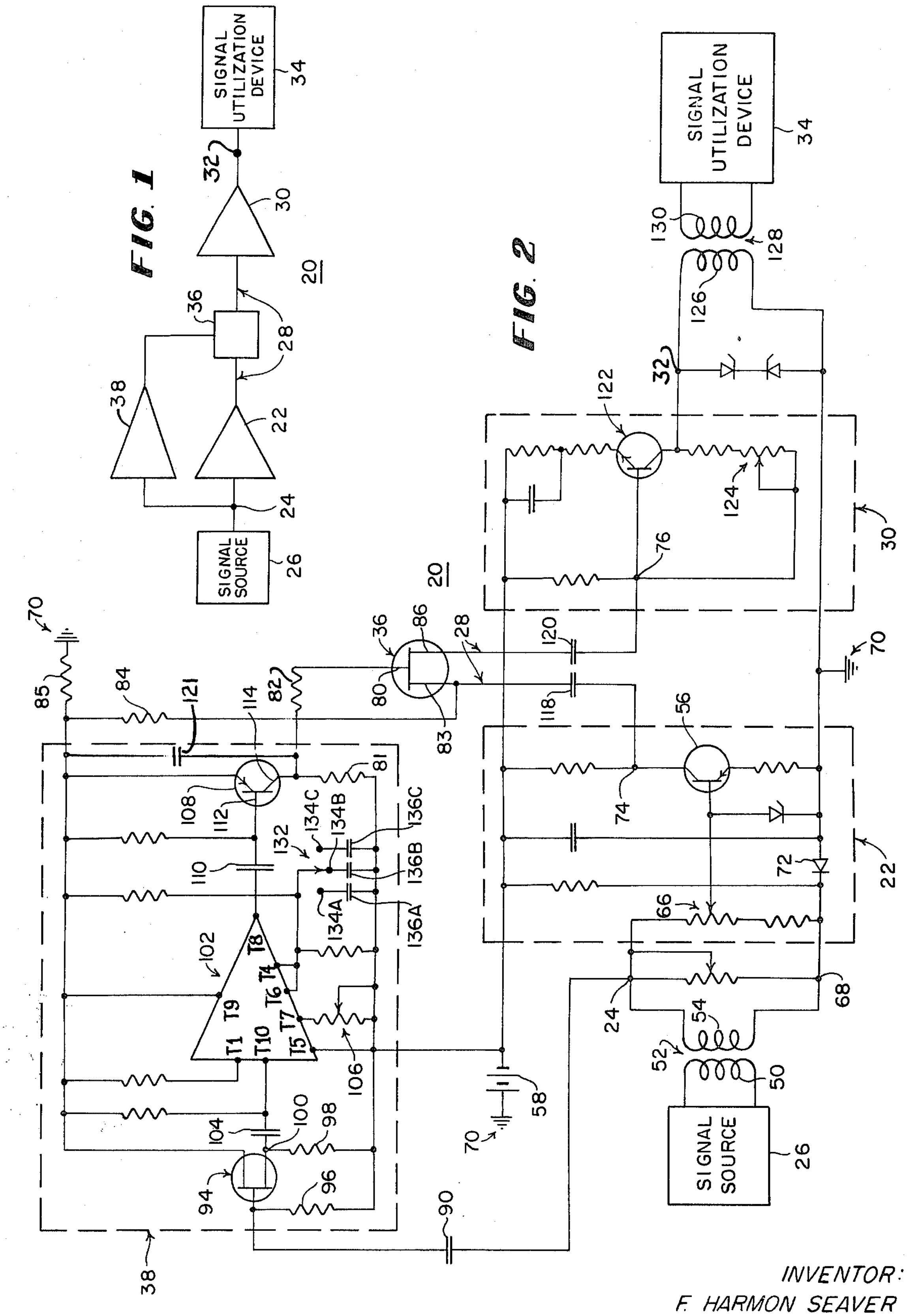

INVENTOR:
F. HARMON SEAVER

BY Mason, Kolehmainen, Rathburn & Wyss
ATTORNEYS

VOICE GATED AMPLIFIER

This invention relates to a voice gated amplifier and, more particularly, to an amplifier with an improved circuit for selectively placing the amplifier in an operating or a standby condition in response to the level of the input signal.

In many circumstances it is desirable to maintain an audio amplifier in a standby or nonoperating state until an input signal of predetermined amplitude is received at the input terminals and then abruptly to place the amplifier in a fully operating state. Previous systems have used relays to control the state of an amplifier, but relays inject a "clicking noise" in the output of the amplifier when operated and for many reasons are not as reliable or satisfactory as a solid state device. Known feedback circuits maintain an amplifier in a standby or nonoperative state in the absence of input signals by reducing the operating bias on a given stage of the amplifier so that in a standby condition the signals received are not amplified to any extent. Some circuits increase a normally low operating bias on a given stage of an amplifier upon receiving a particular external control signal. However, with such an alteration of the operating bias, the input and output impedances of the amplifier are altered which causes a considerable problem when the amplifier is used in systems where impedance matching is an important design consideration. In addition, if the operating bias is changed sufficiently to place an individual amplifier stage outside of its normal operating range, distortion of the output signal occurs, and the audio signals become unintelligible.

Accordingly, important objects of the present invention are to provide a new and improved voice gated amplifier; to provide a new and improved voice gated amplifier that is not subject to signal distortion when selectively placed in a standby or an operating condition; to provide a new and improved voice gated amplifier that has substantial constant input and output impedance regardless of the state of the amplifier; to provide a new and improved voice gated amplifier which is placed in a standby or an operating condition in response to the amplitude of the input signal; and to provide a new and improved voice gated amplifier with a fast attack time and an adjustable turnoff time.

In accordance with these and many other objects, an embodiment of the present invention may comprise a two-stage amplifier having a normally nonconductive first field effect transistor in series relation with a signal path coupling the two stages so that the signal path is interrupted when the amplifier is in a standby, nonoperating condition. As an input signal attains a desired predetermined amplitude, a gating circuit including a second high impedance field effect transistor coupled to an input terminal of the amplifier supplies a forward bias for the first field effect transistor. The first field effect transistor rapidly becomes conductive so that the signal path is no longer interrupted and the amplifier is immediately placed in a fully operating condition.

Many other objects and advantages of the present invention will become apparent from considering the following detailed description in conjunction with the drawings in which:

FIG. 1 is a block diagram of a voice gated amplifier embodying the present invention; and FIG. 2 is a schematic diagram of the voice gated amplifier of FIG. 1.

Referring now more specifically to FIG. 1 of the drawings, there is illustrated a voice gated amplifier indicated generally as 20 embodying the present invention. The amplifier 20 includes a first or input stage 22 coupled to an input terminal 24 that receives signals from any appropriate signal source 26. A signal path 28 couples the first stage 22 to a second or output stage 30. The output of the second stage 30 appears at an output terminal 32 which is coupled to any suitable signal utilization device 34.

Connected in series relation with the signal path 28 is a normally nonconductive controlled conduction device 36 serving to interrupt the signal path 28 thereby to maintain the amplifier 20 in a standby or nonoperating state. As the amplitude of the input signals from the signal source 26 increases above a predetermined amplitude, a gating circuit 38 coupled between the input terminal 24 and the controlled conduction device 36 renders the controlled conduction device 36 abruptly conductive, and the signal path 28 is rendered able to transmit signals between the amplifier stages. Since the controlled conduction device 36 in the standby condition of the amplifier 20 merely interrupts the signal path 28, changes in the state of the amplifier 20 neither effect the input and output impedances of the amplifier 20 nor introduce distortion in the signal being transmitted for no changes occur in the operating levels of the amplifier stages 22 and 30.

Referring now to FIG. 2 of the drawings, there is shown a schematic diagram of the voice gated amplifier 20. The signal source 26, such as a microphone or the like, supplies an input signal to a primary winding 50 of an input isolation transformer 52 having a secondary winding 54. The input signal received at the input terminal 24 from the secondary winding 54 is amplified by the first stage 22 of the amplifier 20. The first stage 22 may be of any desired type, and as illustrated includes a transistor 56 supplied with a biasing potential from an appropriate potential source, such as a battery 58. The gain of the first stage 22 is determined by variable resistor 66 placed in shunting relation across the input terminal 24 and a terminal 68 which is coupled to a common ground terminal 70 by a diode 72.

The output of the first stage 22 appearing at a collector terminal 74 of the transistor 56 is coupled to an input terminal 76 of the second stage 30 through the signal path 28 and the controlled conduction device 36. As previously discussed, the controlled conduction device 36, shown here as a field effect transistor, normally is nonconductive so that no signal is transmitted to the second stage 30 and thereby to the signal utilization device 34, and the amplifier 20 is in it standby or nonoperating state.

In its normal quiescent state the field effect transistor 36 is nonconductive because its gate electrode 80 is maintained at a relatively negative potential by the battery 58 through resistors 81 and 82 as compared with the potential on its source electrode 83 which is coupled to the common ground terminal 70 through resistors 84 and 85. In this nonconductive state the field effect transistor 36 has a very high impedance between its source electrode 83 and its drain electrode 86. Since the impedance between the source electrode 83 and the drain electrode 86 is in series relation with the signal path 28, the signal path 28 is effectively interrupted.

The conductivity of the field effect transistor 36 is controlled by the gating or control circuit 38 coupled to the input terminal 24 through a capacitor 90. The input stage of the gating circuit 38 includes a field effect transistor 94 coupled to the battery 58 by resistors 96 and 98, and to the ground terminal 70 by the resistor 85. The field effect transistor 94 provides the gating circuit 38 with a high input impedance to minimize the effect of the gating ciruct 38 on the operation of the amplifier stage 22.

The output of the field effect transistor 94 appearing at its source electrode 100 is coupled to an integrated amplifier circuit 102 by a coupling capacitor 104. The integrated circuit 102 may be of any suitable type and preferably provides a high impedance with negligible gain when an input signal is below a predetermined amplitude. When the input signal exceeds the predetermined amplitude, the integrated circuit 102 amplifies the signal and transmits the signal to its output terminal More specifically, the integrated circuit 102 shown in FIG. 2 is model No. LM170 squelch amplifier circuit produced by the National Semi-Conductor Corporation, and the terminals thereof are designated as terminals T1 through T10, these being the terminal designations applied to the circuit by the National Semi-Conductor Corporation.

In general the integrated circuit 102 presents an extremely high impedance for the gating circuit 38 as long as the magnitude of the input signal received at its input terminals T1 and T10 from the field effect transistor 94 is below the predetermined amplitude which is selected by a variable resistor 106 connected to a terminal T7. As the signal appearing across the terminals T1 and T10 increases above the predetermined amplitude selected by the variable resistor 106, the integrated circuit 102 amplifies the input signal by providing a 40 db gain to the signal. This circuit is described in detail in a bulletin AN-11 entitled "AGC/ squelch amplifier" published in July, 1968 by National Semi-Conductor Corporation.

The integrated circuit 102 only functions as a signal level sensing device that determines the operational threshold of the field effect transistor 36. By isolating the integrated circuit 102 from the input terminal 24 by the field effect transistor 94 and from the signal path 28 by the field effect transistor 36, the audio being processed by the amplifier stages 22 and 30 is not affected either by any noise, distortion, or the like that might be introduced into the signal amplified by the integrated circuit 102 or by the varying impedance of the integrated circuit 102.

The amplified signal appearing at an output terminal T8 of the integrated circuit 102 is coupled to a normally nonconductive transistor 108 by a coupling capacitor 110. The signal impressed on a base electrode 112 of the transistor 108 is of sufficient magnitude to render the transistor 108 conductive. With the transistor 108 conductive, a relatively positive potential on the gate electrode 80 as compared with the potential of the source electrode 83 is established through a resistor 82 which is coupled to a collector electrode 114 of the transistor 108. The field effect transistor 36 quickly becomes conductive so that the impedance between the source electrode 83 and the drain electrode 86 is negligible and the signal path 28 is no longer interrupted. With the signal path 28 unimpaired, the amplified signal appearing at the output terminal 74 of the first stage 22 is transmitted through the signal path 28 including DC blocking capacitors 118 and 120 and through the low impedance between the source electrode 83 and the drain electrode 86 to the input terminal 76 of the second stage 30.

In order to protect the field effect transistor 36 from being inadvertently rendered conductive or nonconductive by any AC signal appearing at the collector electrode 114 of the transistor 108, a bypass capacitor 121 is coupled between the collector electrode 114 and the resistor 85. Since the AC signal appearing at the collector electrode 114 is bypassed to the common ground terminal 70 through the capacitor 121 and the resistor 85, the AC signal does not interfere with the conductivity of the field effect transistor 36 so that the operational condition of the signal path 28 is altered only in response to the changes in the level of the input signal from the signal source 26.

The second stage 30 may be of any desired construction, and as illustrated is a normal amplifier circuit including a transistor 122 coupled to the battery 58 in order to properly bias the transistor 122. The gain of the amplifier stage 30 is controlled by a variable resistor 124 so that the amplification of the input signal will be dependent on the values selected for the variable resistors 66 and 124.

The amplified signal appearing across the output terminal 32 of the second stage 30 and the ground terminal 70 is coupled to a primary winding 126 of an isolation output transformer 128. The signal appearing on a secondary winding 130 is coupled to the signal utilization device 34 which, for example, can be intercom or telephone equipment or the like.

Once the input signal received from the signal source 26 and coupled to the integrated circuit 102 by the field effect transistor 94 falls below the minimum amplitude selected by adjusting the variable resistor 106 for a predetermined period of time, the integrated circuit 102 returns to its normally high impedance state and does not amplify the signal appearing across its input terminals T1 and T10. Without a signal being coupled to the base 112 of the transistor 108 from the output terminal T8 of the integrated circuit 102, the transistor 108 returns to its normally nonconductive state. As the transistor 108 becomes nonconductive, the capacitor 121 is permitted to charge through the resistor 81. During the short period of time in which the capacitor 121 is charging, the potential on the gate electrode 80 of the field effect transistor 36 remains relatively positive, and the field effect transistor 36 remains conductive. Once the capacitor 121 is charged, the relatively negative potential again is supplied to the gate electrode 80 of the field effect transistor 36 by the resistors 81 and 82 from the battery 58 causing the field effect transistor 36 abruptly to become nonconductive. The high impedance between the source electrode 83 and the drain electrode 86 once again interrupts the signal path 28 so that the voice gated amplifier 20 is returned to its standby state.

The total duration or turnoff time occuring after the input signal falls below the threshold value before the voice gated amplifier 20 is placed in its standby condition normally is determined by the combined delay caused by the turnoff time of the integrated circuit 102 and the charging time of the capacitor 121. The turnoff time of the integrated circuit 102 or the duration before the integrated circuit 102 returns to its normal high impedance state is controlled by the value of the capacitance connected to the shorted terminals T4 and T6. In order to have this predetermined period of time or turnoff time be adjustable, a multi-position switch 132 is connected to the shorted terminals T4 and T6 for selectively closing a switch contact 134A, 134B, or 134C so that a capacitor 136A, 136B, or 136C, respectively, is connected through the switch 132 to the shorted terminals T4 and T6. By selecting a suitable range of capacitance values for capacitors 136A, 136B, and 136C, the desired delay in the turnoff time of the integrated circuit 102 can be selected.

However, whenever the input signal from the signal source 26 diminishes to a zero amplitude, the integrated circuit 102 does not supply the transistor 108 with an amplified signal, and the transistor 108 immediately becomes nonconductive. The field effect transistor 36 also becomes nonconductive and interrupts the signal path 28 even though the amplitude of the input signal is not below the threshold amplitude for the specified period of time. However, the capacitor 121, which is discharged whenever the transistor 108 is conductive, begins to charge as the transistor 108 is rendered nonconductive, and the field effect transistor 36 is maintained conductive for the period of time during which the capacitor 121 is charging. In this particular situation of the input signal diminishing to a zero amplitude, the time delay before the signal path 28 is interrupted is determined solely by the changing time of the capacitor 121 rather than the combined delay caused by the turnoff time of the integrated circuit 102 and by the charging time of the capacitor 121.

By properly selecting the value of the capacitance connected to the short terminals T4 and T6 of the integrated circuit 102 and the value of the capacitor 121, the voice gated amplifier 20 is maintained in its operating condition for a desired period of time after the input signal decreases below the predetermined amplitude even if the amplitude diminishes to a zero value. On the other hand, since both the integrated circuit 102 and the field effect transistor 36 have extremely fast response times, the voice gated amplifier 20 is rapidly placed in its operating state in response to an input signal attaining the predetermined or threshold amplitude selected by the variable resistor 106.

While the present invention has been described in connection with the details of one illustrative embodiment thereof, it should be understood that these details are not intended to limit the invention except insofar as set forth in the accompanying claims.

What is claimed and desired to be secured by Letters Patent of the United States is:

1. A voice gated, multi-stage amplifier having an input terminal to receive input signals and a signal path coupling the successive stages of the amplifier, said amplifier comprising:

a normally nonconductive field effect transistor having a gate electrode, drain and source electrodes, and an interrupt circuit between said drain and source electrodes, said drain and source electrodes being coupled in series relation with the signal path so that said interrupt circuit normally interrupts the signal path and so that said interrupt circuit provides a variable impedance circuit between said drain and source electrodes.

and a gating circuit coupling the gate electrode of said field effect transistor to the input terminal and rendering the field effect transistor conductive in response to an increase of the input signals above a predetermined amplitude so that said interrupt circuit does not interrupt the signal path.

2. A voice gated, multi-stage amplifier having an input terminal to receive input signals and a signal path coupling the successive stages of the amplifier, said amplifier comprising:

a normally nonconductive first controlled conduction means having a control electrode, a pair of output electrodes, and an interrupt circuit between said output electrodes, said output electrodes being coupled in series relation with the signal path so that said interrupt circuit normally interrupts the signal path;

and a gating circuit coupling the control electrode of said first controlled conduction means to the input terminal and rendering the first controlled conduction means conductive in response to an increase of the input signals above a predetermined amplitude so that said interrupt circuit does not interrupt the signal path, said gating circuit including a signal responsive amplifier circuit to detect the increase of said input signals above the predetermined amplitude, a field effect transistor coupling said signal responsive amplifier circuit to said input terminal and establishing a high input impedance for said gating circuit, and a second normally nonconductive conduction means coupling the signal responsive amplifier circuit to the first controlled conduction means.

3. A voice gated amplifier having at least first and second stages, an input terminal to receive input signals, and a signal path coupling said first and second stages of the amplifier, said amplifier comprising:

a field effect transistor having a gate electrode, a drain electrode , a source electrode, and an interrupt circuit between said drain and source electrodes, said interrupt circuit being coupled in series relation with the signal path and operable to two different states so that said interrupt circuit provides a variable impedance circuit between said drain and source electrodes, and a gating circuit coupling the gate electrode of the field effect transistor to the input terminal and selectively altering the state of the interrupt circuit in response to an increase of the input signals above a predetermined amplitude.

4. A voice gated amplifier having at least first and second stages, an input terminal to receive input signals, and a signal path coupling said first and second stages of the amplifier, said amplifier comprising:

a first controlled conduction means having a control electrode, first and second output electrodes, and an interrupt circuit between said first and second output electrodes, said interrupt circuit being coupled in series relation with the signal path and operable to two different states, and a gating circuit coupling the control electrode of the first controlled conduction means to the input terminal and selectively altering the state of the interrupt circuit in response to an increase of the input signals above a predetermined amplitude, said gating circuit including a signal responsive amplifier circuit supplying a control output signal in response to increases of said input signal above the predetermined amplitude, a field effect transistor coupling said signal responsive amplifier circuit to said input terminal, and a second normally nonconductive controlled conduction means coupled between the signal responsive amplifier circuit and the first controlled conduction means, said second controlled conduction means altering the state of said first controlled conduction means when said second controlled conduction means is rendered conductive in response to said control output signal.

5. A voice gated amplifier as set forth in claim 4 wherein the field effect transistor provides a high input impedance for the gating circuit.

* * * * *